(12) United States Patent
Huo et al.

(10) Patent No.: US 8,405,137 B2
(45) Date of Patent: Mar. 26, 2013

(54) SINGLE TRANSISTOR FLOATING-BODY DRAM DEVICES HAVING VERTICAL CHANNEL TRANSISTOR STRUCTURES

(75) Inventors: Zong-Liang Huo, Gyeonggi-do (KR); Seung-Jae Baik, Seoul (KR); In-Seok Yeo, Seoul (KR); Hong-Sik Yoon, Seoul (KR); Shi-Eun Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 13/301,254

(22) Filed: Nov. 21, 2011

(65) Prior Publication Data

US 2012/0061752 A1   Mar. 15, 2012

Related U.S. Application Data

(62) Division of application No. 11/380,946, filed on May 1, 2006, now Pat. No. 8,084,316.

(30) Foreign Application Priority Data

May 3, 2005 (KR) .................. 10-2005-0037244

(51) Int. Cl.
*H01L 29/788* (2006.01)

(52) U.S. Cl. ......... 257/315; 257/316; 257/317; 257/318
(58) Field of Classification Search ........... 257/315–318
See application file for complete search history.

(56) References Cited

U.S. PATENT DOCUMENTS

| 5,017,504 A | 5/1991 | Nishimura et al. |
| 5,739,567 A | 4/1998 | Wong |
| 6,861,689 B2 | 3/2005 | Burnett |
| 2003/0168680 A1 | 9/2003 | Hsu |
| 2005/0032313 A1* | 2/2005 | Forbes .................. 438/270 |

FOREIGN PATENT DOCUMENTS

JP   06-314793 A   11/1994

* cited by examiner

*Primary Examiner* — Samuel Gebremariam
(74) *Attorney, Agent, or Firm* — Myers Bigel Sibley & Sajovec, P.A.

(57) ABSTRACT

Single transistor floating-body DRAM devices have a vertical channel transistor structure. The DRAM devices include a substrate, and first and second floating bodies disposed on the substrate and isolated from each other. A source region and a drain region are disposed under and above each of the first and second floating bodies. A gate electrode is disposed between the first and second floating bodies. Methods of fabricating the single transistor floating-body DRAM devices are also provided.

12 Claims, 15 Drawing Sheets

US 8,405,137 B2

SINGLE TRANSISTOR FLOATING-BODY DRAM DEVICES HAVING VERTICAL CHANNEL TRANSISTOR STRUCTURES

REFERENCE TO PRIORITY APPLICATION

This application is a divisional of U.S. application Ser. No. 11/380,946, filed May 1, 2006 now U.S. Pat. No. 8,084,316 entitled Method of Fabricating Single Transistor Floating-Body DRAM Devices Having Vertical Channel Transistor Structures, which itself claims the benefit of Korean Patent Application No. 10-2005-0037244, filed May 3, 2005, the contents of which are hereby incorporated herein by reference in their entirety.

FIELD OF THE INVENTION

The present invention relates to semiconductor memory devices and methods of fabricating the same and, more particularly, to single transistor floating-body dynamic random access memory (DRAM) devices and methods of fabricating the same.

BACKGROUND OF THE INVENTION

In general, a DRAM cell includes one transistor and one capacitor, which are disposed on an active region. The DRAM cell uses the capacitor to store data in response to a "high-state" or "low-state." Accordingly, the DRAM cell includes an area occupied by the capacitor.

Recently, a DRAM cell that does not need a capacitor has been proposed. This DRAM cell is referred to as a single transistor floating-body DRAM cell (hereinafter, a 'single transistor DRAM cell'). The single transistor DRAM cell includes a floating body. The floating body of the single transistor may be disposed on a silicon-on-insulator (SOI) substrate. As a result, the body of the single transistor is electrically isolated from adjacent bodies and floated. Since the single transistor DRAM cell stores data in the floating body, it does not require a capacitor. Therefore, a cell region may be reduced so that the DRAM cell can be improved in integration density.

FIG. 1 is a cross-sectional view of a conventional single transistor DRAM cell.

Referring to FIG. 1, the single transistor DRAM cell includes an SOI substrate 1. The SOI substrate 1 includes a semiconductor substrate 2, a buried insulating layer 3 disposed on the semiconductor substrate 2, and a floating body 4 disposed on the buried insulating layer 3. The buried insulating layer 3 may be formed of silicon oxide. A pair of source and drain regions 5 and 6 are disposed on both sides of the floating body 4. An insulated gate electrode 7 is disposed on the floating body 4. A gate insulating layer 8 is interposed between the insulated gate electrode 7 and the floating body 4. As a result, the floating body 4 is electrically isolated by the buried insulating layer 3, the gate insulating layer 8, and the source and drain regions 5 and 6.

Hereinafter, a write operation of a conventional single transistor DRAM cell having the above-described construction will be described. During the write operation, the DRAM cell can store data in the following process. First, the source region 5 is grounded. A word line program voltage equal to or higher than a threshold voltage is applied to the gate electrode 7. Also, a bit line program voltage is applied to the drain region 6. In this case, the bit line program voltage is higher than the word line program voltage. When the bit line program voltage is Vd, the word line program voltage may be Vd/2. As a result, impact ionization occurs around the drain region 6. When the transistor is an NMOS transistor, hot carriers, i.e., holes, are accumulated in an active region 9 of the floating body 4 due to the impact ionization. The threshold voltage of the transistor depends on the number of the holes accumulated in the active region 9 of the floating body 4. The number of the holes accumulated in the active region 9 of the floating body 4 can be controlled by adjusting the amount of current flowing between the source and drain regions 5 and 6.

Hereinafter, a read operation of the conventional single transistor DRAM cell will be described. During the read operation, the DRAM cell can read data in the following process. First, the source region 5 is grounded. A word line read voltage lower than the word line program voltage is applied to the gate electrode 7. In this case, a bit line read voltage is applied to the drain region 6. As a result, the amount of current flowing between the source and drain regions 5 and 6 depends on the number of holes stored in the active region 9 of the floating body 4. That is, data stored in the single transistor DRAM cell can be read by sensing the amount of current flowing between the source and drain regions 5 and 6.

The above-described single transistor DRAM cell is also described in U.S. Pat. No. 6,861,689 to Burnett.

In the conventional single transistor DRAM cell having the above-described construction and function, a short channel effect (SCE) may occur with the downscaling of DRAM memory devices. As a result, the operating characteristics of the DRAM cell may still deteriorate.

Moreover, in order to increase the integration density of DRAM memory devices, the DRAM memory devices are being scaled down or reduced in number. However, a reduction in the number of the DRAM memory devices may result in a decrease of memory storage capability.

SUMMARY OF THE INVENTION

Some embodiments of the invention provide single transistor floating-body DRAM devices having a vertical channel transistor structure.

Other embodiments of the invention provide methods of fabricating single transistor floating-body DRAM devices, which can improve the integration density of memory devices.

In some embodiments of the present invention, single transistor floating-body DRAM devices include a substrate, an insulating layer on the substrate and a semiconductor layer on the insulating layer, remote from the substrate. The semiconductor layer includes a semiconductor source region on the insulating layer, a semiconductor floating-body region on the semiconductor source region remote from the insulating layer and a semiconductor drain region on the semiconductor floating-body region remote from the semiconductor source region. The respective semiconductor source and drain regions define respective first and second semiconductor junctions with the semiconductor floating-body region at respective opposite ends thereof. The respective semiconductor source and drain regions further define at least one sidewall of the semiconductor floating-body region therebetween. An insulating region is provided on the semiconductor floating-body region that is configured to electrically isolate the at least one sidewall of the semiconductor floating-body region so as to allow charge carriers to be stored in the semiconductor floating-body region that is isolated. A gate electrode is provided on the insulating region remote from the semiconductor floating-body region.

Other embodiments of the invention are also directed to single transistor floating-body DRAM devices having a vertical channel transistor structures. The single transistor floating-body DRAM devices include a substrate, and first and second floating bodies disposed on the substrate. A source region and a drain region are respectively disposed under and above each of the first and second floating bodies. A gate electrode is disposed between the first and second floating bodies.

In some embodiments of the present invention, the source region and the drain region may be impurity regions of a first conductivity type, and the first and second floating bodies comprise a semiconductor layer of a second conductivity type different from the first conductivity type.

In other embodiments, the first conductivity type may be an N-type, and the second conductivity type may be a P-type.

In yet other embodiments, one end of the gate electrode may extend and cross over the first and second floating bodies.

In yet other embodiments, the gate electrode may include a first gate electrode and a second gate electrode, which are electrically insulated from each other. The first gate electrode may cover sidewalls of the first floating body, and the second gate electrode may cover sidewalls of the second floating body.

In yet other embodiments, the source region may be a common source region.

In yet other embodiments, the single transistor floating-body DRAM device may further include a bit line disposed on the first and second floating bodies and electrically connected to the drain region.

In yet other embodiments, the single transistor floating-body DRAM device may further include a word line electrically connected to the gate electrode.

In yet other embodiments, the single transistor floating-body DRAM device may further include an isolation layer surrounding sidewalls of the first and second floating bodies.

In yet other embodiments, the single transistor floating-body DRAM device may further include a backgate electrode on sidewalls of the first and second floating bodies.

In yet other embodiments, the single transistor floating-body DRAM device may further include a gate insulating layer interposed between the first and second floating bodies and the gate electrode.

In yet other embodiments, the single transistor floating-body DRAM device may further include a buried insulating layer interposed between the substrate and the source region.

In another aspect, the present invention is directed to methods of fabricating single transistor floating-body DRAM devices, which are capable of improving the integration density of memory devices. The methods include forming a body layer on a semiconductor substrate having a buried insulating layer therein. Impurity ions of a first conductivity type are implanted into a lower region of the body layer, thereby forming a source region. Impurity ions of a second conductivity type are implanted into a region of the body layer that is disposed on the source region. Here, the second conductivity type is different from the first conductivity type. Impurity ions of the first conductivity type are implanted into an upper region of the body layer, thereby forming a drain region. The body layer having the source and drain regions is patterned, thereby forming a body layer pattern such that the buried insulating layer is exposed. The body layer pattern is patterned, thereby forming first and second floating bodies that are isolated from each other. Thereafter, a gate electrode is formed between the first and second floating bodies.

In some embodiments of the present invention, the formation of the first and second floating bodies may include forming a photoresist pattern on the body layer, and forming an opening in the body layer to expose the source region by selectively etching the body layer using the photoresist pattern as an etch mask.

In other embodiments, the first conductivity type may be an N-type, and the second conductivity type may be a P-type.

In yet other embodiments, an isolation layer may be formed on the semiconductor substrate having the first and second floating bodies to cover sidewalls of the first and second floating bodies, prior to forming the gate electrode.

In yet other embodiments, a drain line may be further formed to cross over the first and second floating bodies such that it is electrically connected to the drain region.

In yet other embodiments, a backgate electrode may be further formed on the semiconductor substrate having the first and second floating bodies on sidewalls of the first and second floating bodies.

DETAILED DESCRIPTION OF THE INVENTION

Figure 1:
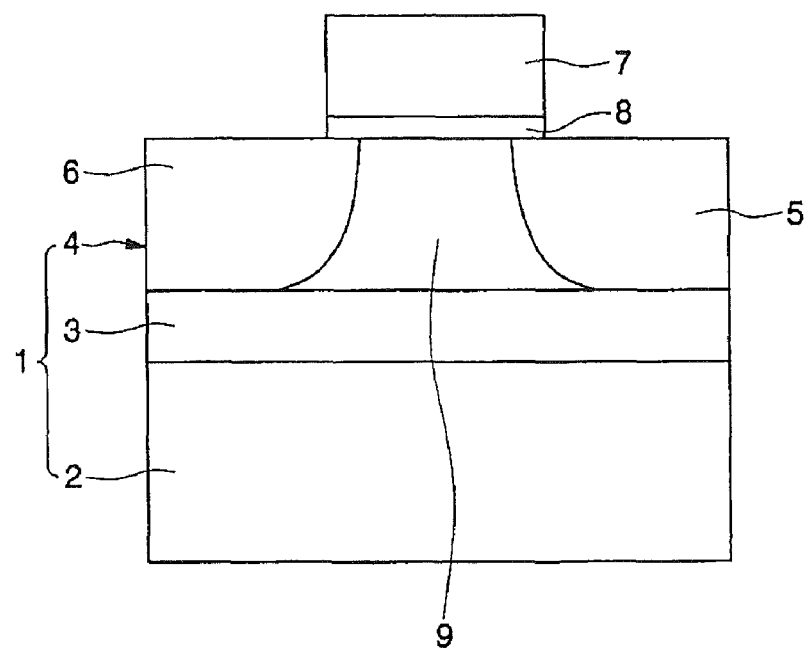
FIG. 1 is a cross-sectional view of a conventional single transistor DRAM device.

The present invention is described more fully hereinafter with reference to the accompanying drawings, in which example embodiments of the present invention are shown. The present invention may, however, be embodied in many different forms and should not be construed as limited to the embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "under", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "above" the other elements or features. Thus, the exemplary term "under" can encompass both an orientation of above and below. The device may be otherwise oriented (rotated 180 degrees or at other orientations) and the spatially relative descriptors used herein interpreted accordingly.

The terminology used herein is for the purpose of describing particular embodiments only and is not intended to be limiting of the present invention. As used herein, the singular forms "a", "an" and "the" are intended to include the plural fauns as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
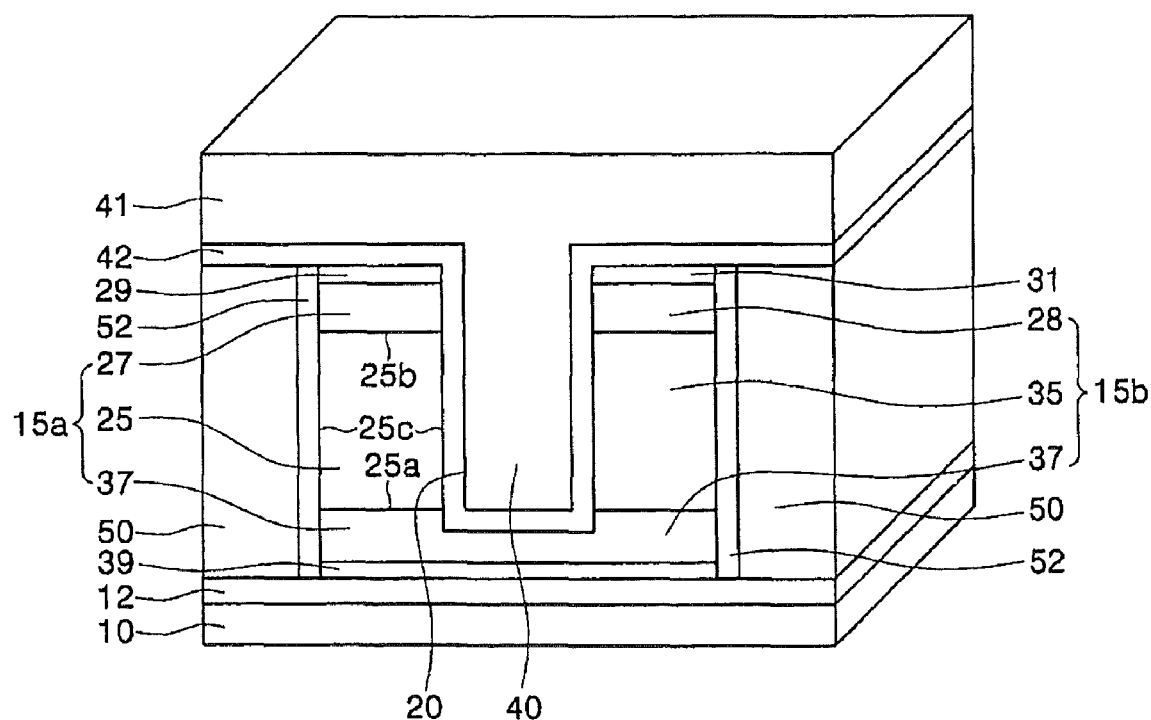
FIGS. 2, 4, and 6 are perspective views of single transistor floating-body DRAM devices according to exemplary embodiments of the present invention.
Figure 3:
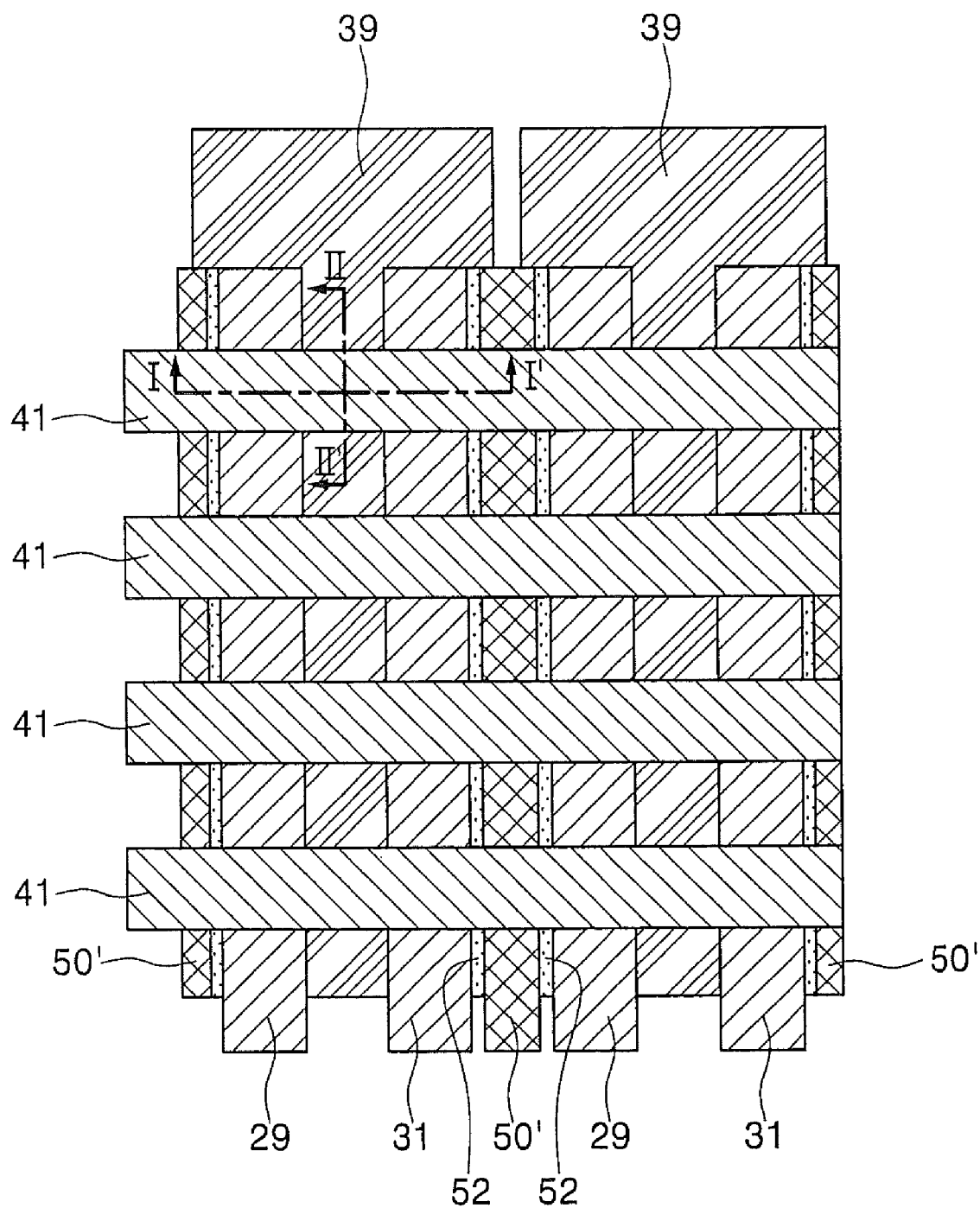
FIGS. 3, 5, and 7 illustrate the layouts of the single transistor floating-body DRAM devices shown in FIGS. 2, 4, and 6, respectively.
Figure 4:
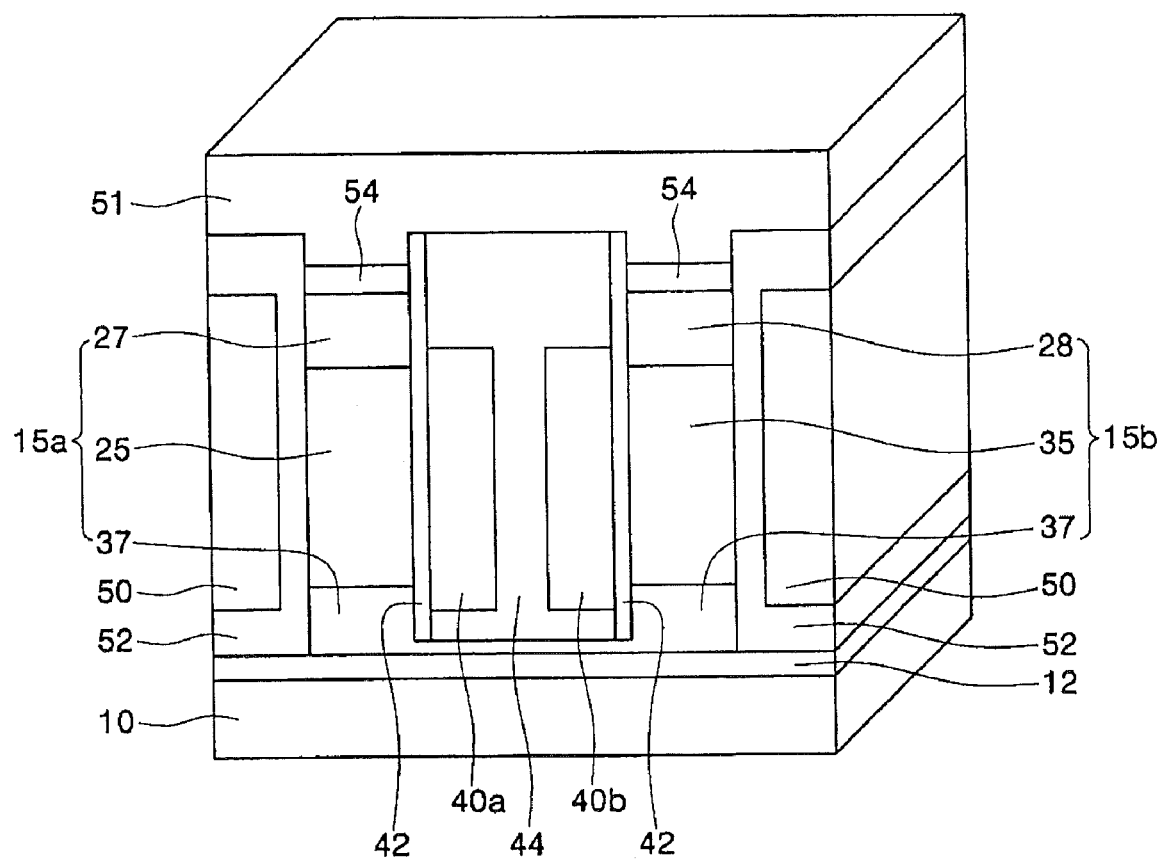
Figure 5:
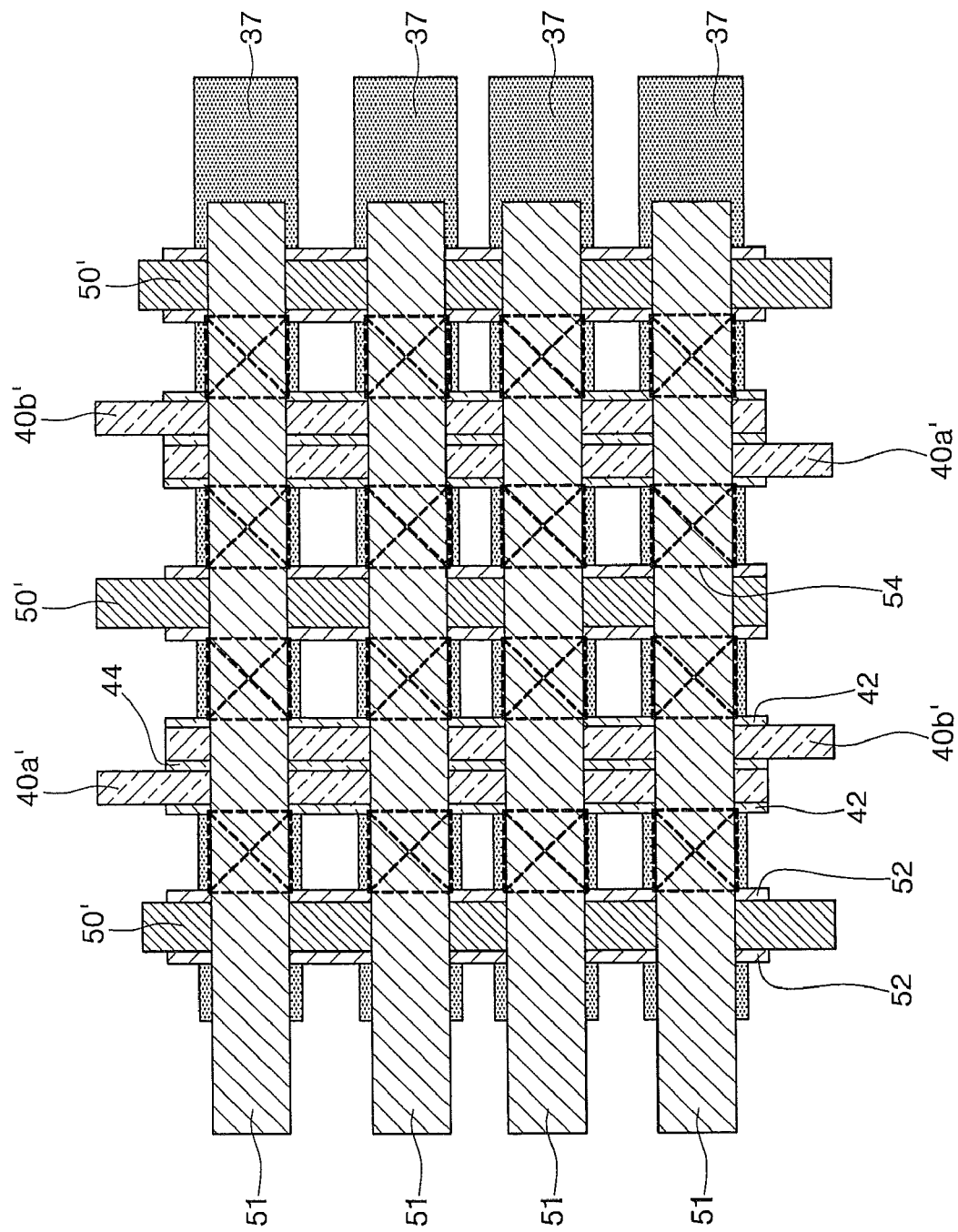
Figure 6:
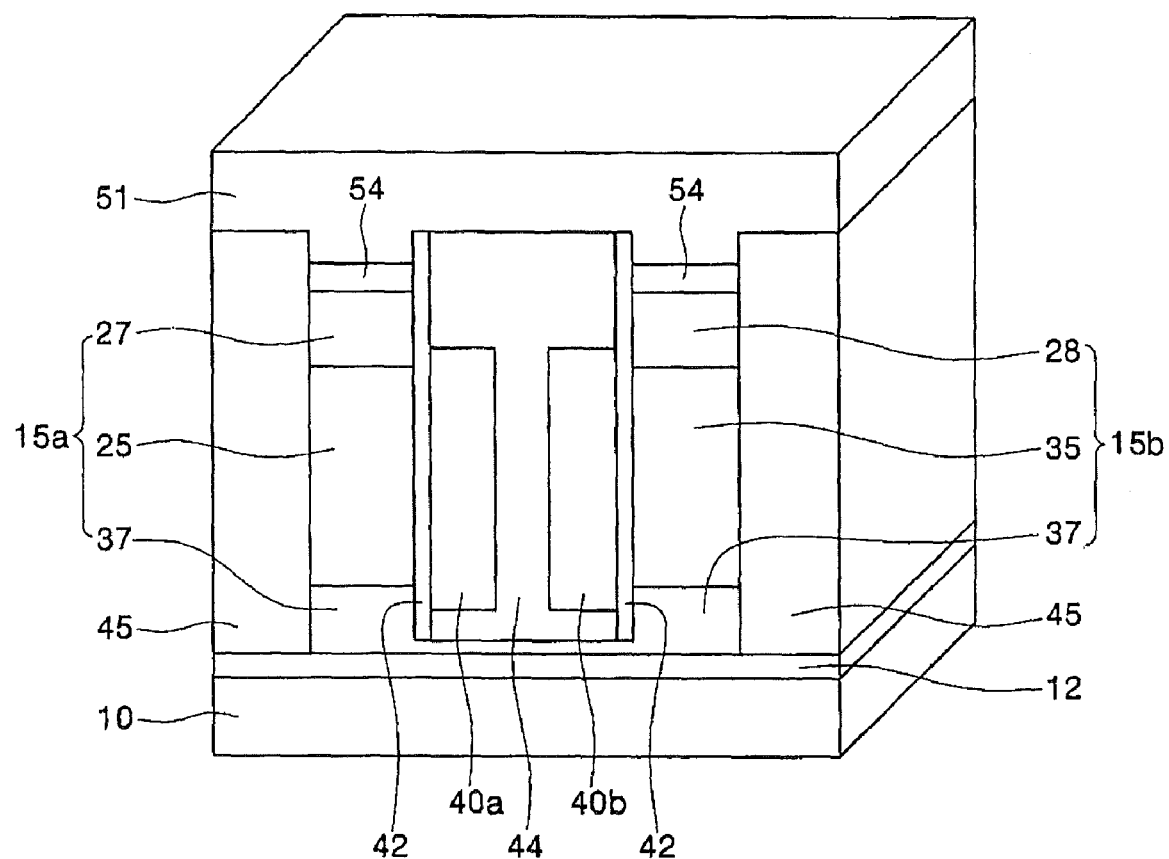
Figure 7:
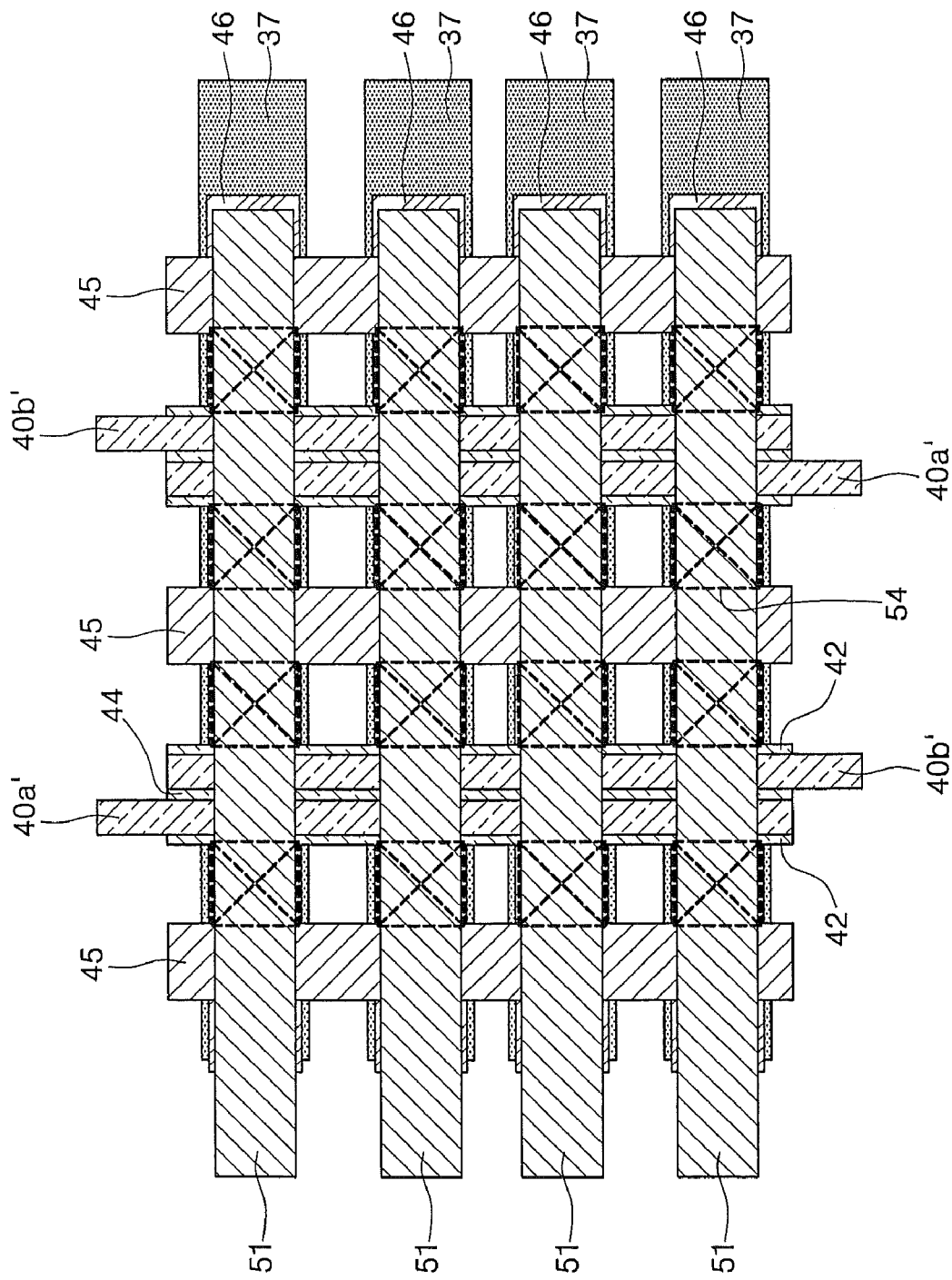

FIGS. 2, 4, and 6 are perspective views of single transistor floating-body DRAM devices according to exemplary embodiments of the present invention; FIGS. 3, 5, and 7 illustrate the layouts of the single transistor floating-body DRAM devices shown in FIGS. 2, 4, and 6, respectively; FIGS. 8A, 9A, 10A, 11A, 12A, 13A, 14A, 15A, and 16A are cross-sectional views taken along line I-I' of FIG. 3, which illustrate the single transistor floating-body DRAM devices according to exemplary embodiments of the present invention and methods of fabricating the same; and FIGS. 8B, 9B, 10B, 11B, 12B, 13B, 14B, 15B, and 16B are cross-sectional views taken along line II-II' of FIG. 3, which illustrate the single transistor floating-body DRAM devices according to exemplary embodiments of the present invention and methods of fabricating the same.

Referring to FIGS. 2 and 3, single transistor floating-body DRAM devices (hereinafter, 'single transistor DRAM devices') include a first vertical body 15a and a second vertical body 15b, which are disposed on a substrate such as a semiconductor substrate 10. A buried insulating layer 12 is interposed between the semiconductor substrate 10 and the first and second vertical bodies 15a and 15b. The buried insulating layer 12 may be a silicon oxide layer. The first and second vertical bodies 15a and 15b may be silicon bodies. A source region 37 is disposed in a lower region of each of the first and second vertical bodies 15a and 15b, and a drain region 27 and 28 is disposed in an upper region of each of the respective first and second vertical bodies 15a and 15b. The first and second vertical bodies 15a and 15b may have the source region 37 in common. A gate electrode 40 is disposed between the first and second vertical bodies 15a and 15b. The gate electrode 40 may be formed of a polysilicon layer. Each of the first and second vertical bodies 15a and 15b includes a floating body 25, 35 respectively, that is isolated by the gate electrode 40. That is, the first vertical body 15a includes a first floating body 25, and the second vertical body 15b includes a second floating body 35. Data is stored in the first and second floating bodies 25 and 35.

Accordingly, single transistor DRAM devices according to some embodiments of the present invention provide a pair of floating bodies 25, 35. Each of the first and second vertical bodies 15a and 15b may include a source region and a drain region. In other words, the source and drain regions are positioned under and above each of the first and second floating bodies 25 and 35. In this case, a first drain region 27 may be disposed above the first floating body 25, and a second drain region 28 may be disposed above the second floating body 35. Also, a source electrode 39 may be disposed under the source region. The source region may be a common source region 37. That is, the source region may be shared by the first and second floating bodies 25 and 35. One end of the gate electrode 40 may be adjacent to the common source region 37. Similarly, a first drain electrode 29 may be disposed on the first drain region 27, and a second drain electrode 31 may be disposed on the second drain region 28. The first and second drain electrodes 29 and 31 may be disposed parallel to each other. Also, the drain electrodes 29 and 31 may be disposed parallel to the source electrode 39.

A gate insulating layer 42 is interposed between the gate electrode 40 and the first and second vertical bodies 15a and 15b. For example, the gate insulating layer 42 is interposed between the gate electrode 40 and the first and second floating bodies 25 and 35. Also, both ends of the gate insulating layer 42 may extend and be interposed between the gate electrode 40 and the common source region 37 and between the gate electrode 40 and the drain regions 27 and 28. The gate insulating layer 42 may be a silicon oxide layer. As a result, the first and second floating bodies 25 and 35 may be electrically isolated from each other by the gate insulating layer 42. Likewise, the first and second drain regions 27 and 28 may be electrically isolated from each other by the gate insulating layer 42.

Furthermore, an isolation layer 45 may be disposed on the semiconductor substrate 10 to surround sidewalls of the first and second vertical bodies 15a and 15b (refer to FIG. 6). As a result, the first and second floating bodies 25 and 35 are electrically isolated by the gate insulating layer 42, the common source region 37, the first and second drain regions 27 and 28, and the isolation layer 45 (refer to FIG. 6). The isolation layer 45 may be obtained by a shallow trench isolation (STI) process. The isolation layer 45 may be a high density plasma (HDP) oxide layer.

Backgate electrodes 50 may be disposed across one sidewall of the first and second floating bodies 25 and 35. In this case, backgate insulating layers 52 may be positioned instead of the isolation layer 45 on the one sidewall of the first and second floating bodies 25 and 35. That is, the backgate insulating layers 52 may be interposed between the first and second floating bodies 25 and 35 and the backgate electrodes 50. The backgate insulating layers 52 may be silicon oxide layers. Both ends of the backgate electrodes 50 may extend to lateral portions of the source region 37 and the drain regions 27 and 28. In this case, both ends of the backgate insulating layers 52 may extend and be interposed between the source region 37 and the backgate electrodes 50 and between the drain regions 27 and 28 and the backgate electrodes 50. The backgate electrodes 50 may function as common backgate electrodes of adjacent memory cells.

Meanwhile, when the source region 37 and the drain regions 27 and 28 are impurity regions of a first conductivity type, the first and second floating bodies 25 and 35 may be formed of a semiconductor layer of a second conductivity type that is different from the first conductivity type. For example, when the first conductivity type is an N-type, the second conductivity type may be a P-type. Also, when the first conductivity type is a P-type, the second conductivity type is an N-type.

The gate electrode 40 may include a gate line 41, which extends from the gate electrode 40 and crosses over the first and second floating bodies 25 and 35. In this case, an extension of the gate insulating layer 42 may be interposed between the drain regions 27 and 28, which are disposed on the first and second floating bodies 25 and 35, and the gate line 41. The gate line 41 may be disposed to cross over the drain electrodes 29 and 31.

Furthermore, a bit line (not shown) may be disposed to be electrically connected to the first and second drain regions 27 and 28. In this case, the drain electrodes 29 and 31 may function as the bit line. Also, a word line (not shown) may be disposed to be electrically connected to the gate electrode 40. In this case, the gate line 41 may function as the word line.

Still referring to FIG. 2, other embodiments of the present invention may be regarded as including a substrate 10, an insulating layer 12 on the substrate and a semiconductor layer 15a on the insulating layer 12 remote from the substrate 10. The semiconductor layer 15a comprises a semiconductor source region 37 on the insulating layer 12, a semiconductor floating body region 25 on the semiconductor source region 37 remote from the insulating layer 12 and a semiconductor drain region 27 on the semiconductor floating body region 25 remote from the semiconductor source region 37. The respective semiconductor source and drain regions 37, 27 define respective first and second semiconductor junctions with the semiconductor floating body region 25 on opposite ends 25a, 25b thereof and further define at least one sidewall 25c of the semiconductor floating body region 25 therebetween. An insulating region 12, 42, 52 is provided on the semiconductor floating body region 25 and is configured to electrically isolate the at least one sidewall 25c of the semiconductor floating body region 25 so as to allow charge carriers to be stored in the semiconductor floating body region 25 that is isolated. A gate electrode 40, 50 may be provided on the insulating region 12, 42, 52 remote from the semiconductor floating body region 25.

Referring to FIGS. 4 through 7, the gate electrode 40 may include a first gate electrode 40a and a second gate electrode 40b, which are electrically isolated from each other. That is, an inter-gate insulating layer 44 may be interposed between the first and second gate electrodes 40a and 40b. As a result, the first and second gate electrodes 40a and 40b are electrically isolated by the inter-gate insulating layer 44. In this case, a bit line 51 may be disposed in place of the gate line 41 shown in FIGS. 2 and 3. Both ends of the source region 37 may extend and be disposed parallel to the bit line 51. Both ends of the first and second gate electrodes 40a and 40b may extend to form a first gate line 40a' and a second gate line 40b'. The bit line 51 may be disposed to cross over the gate lines 40a' and 40b'.

The bit line 51 may be electrically connected to the first and second drain regions 27 and 28. One end of the backgate insulating layers 52 interposed between the backgate electrodes 50 and the floating bodies 40a and 40b may extend and electrically isolate the bit line 51 from the backgate electrodes 52. Also, the inter-gate insulating layer 44 may extend and be disposed on and under the first and second gate electrodes 40a and 40b. As a result, the bit line 51 may be electrically isolated from the first and second gate electrodes 40a and 40b by the inter-gate insulating layer 44. In this case, the word line (not shown) may be disposed across the bit line 51 and electrically connected to the first and second gate electrodes 40a and 40b.

The first gate electrode 40a may be disposed across one sidewall of the first floating body 25 and adjacent to the first floating body 25. Likewise, the second gate electrode 40b may be disposed across one sidewall of the second floating body 35 and adjacent to the second floating body 35. The gate insulating layer 42 may be interposed between the first floating body 25 and the first gate electrode 25 and between the second floating body 35 and the second gate electrode 40b.

Further, a drain region contact plug 54 may be disposed on the drain region 27. As a result, the drain region 27 may be connected to the bit line 51 by the drain region contact plug 54.

A single transistor DRAM device according to some embodiments of the present invention as shown in FIGS. 4 and 5 may include the backgate electrodes 50, which are disposed across one sidewalls of the floating bodies 25 and 35. In this case, backgate lines 50' may be disposed to be electrically connected to the backgate electrodes 50. The backgate lines 50' may be disposed parallel to the drain electrodes 29 and 31. The backgate insulating layers 52 may be interposed between one sidewalls of the floating bodies 25 and 35 and the backgate electrodes 50. A single transistor DRAM device according to some embodiments of the present invention as shown in FIGS. 6 and 7 may include the isolation layer 45 instead of the backgate electrodes 50.

Hereinafter, methods of operating memory cells of the above-described single transistor DRAM devices according to some embodiments of the invention will be described.

Referring to FIG. 2, it is assumed that the source region 37 and the first and second drain regions 27 and 28 are N-type impurity regions, and the first and second floating bodies 25 and 35 are formed of a P-type semiconductor layer. That is, the transistor is assumed to be an NMOS transistor.

First, a write operation and an erase operation of the memory cell of a single transistor DRAM device according to some embodiments of the invention will be described. During the write operation, logic data "1" may be written in the memory cell. Also, during the erase operation, logic data "0" may be written in the memory cell.

The write operation may be performed by hot carrier injection (HCI). For example, the source region 37 is grounded. The source region 37 may be a common source region. A word line program voltage equal to or higher than a threshold voltage is applied to the gate electrode 40. A bit line program voltage is applied to the first drain region 27. The bit line program voltage may be higher than the word line program voltage. For example, the bit line program voltage may be at least twice as high as the word line program voltage. Thus, a conductive channel may be formed between the source region 37 and the first drain region 27. The conductive channel is vertically formed in embodiments of FIG. 2.

During the write operation, carrier pairs are generated in the first floating body 25 adjacent to the first drain region 27. The carrier pairs include electrons and holes. When the transistor is an NMOS transistor, the electrons are emitted through the first drain region 27, and the holes are accumulated in the first floating body 25. The accumulated holes elevate a potential of the first floating body 25, thus lowering a threshold voltage.

Alternatively, the write operation may be performed by a band-to-band tunneling (BTBT) method. For example, a negative word line program voltage is applied to the gate electrode 40, while positive program voltages are applied to the source region 37 and the first drain region 27. As a result, carrier pairs are generated in the first floating body 25 adjacent to the source region 37 and the first drain region 27. The carrier pairs include electrons and holes. When the transistor is an NMOS transistor, the electrons are emitted through the source region 37 and the first drain region 27, and the holes are accumulated in the first floating body 25. The accumulated holes elevate a potential of the first floating body 25, thus lowering the threshold voltage.

The foregoing write operation of a memory cell of a single transistor DRAM device is performed by accumulating holes in the first floating body 25. Further, a write operation of the single transistor DRAM device can be performed by accumulating holes in the second floating body 35 using the above-described methods. Accordingly, since the single transistor DRAM device of the present invention can store 2-bit data using a pair of floating bodies, semiconductor memory devices can be substantially improved in integration density.

The erase operation can make use of a tunneling method. For example, the source region 37 is grounded. The source region 37 may be a common source region. A positive erase voltage is applied to the gate electrode 40, while a negative bit line erase voltage is applied to the first drain region 27. During the erase operation, holes accumulated in the first floating body 25 are emitted through the first drain region 27. The erase operation causes a potential of the first floating body 25 to relatively decline. As the potential of the first floating body 25 declines, the threshold voltage can be relatively raised.

The foregoing erase operation of a memory cell of a single transistor DRAM device is performed by emitting holes from the first floating body 25. Further, an erase operation of a single transistor DRAM device can be performed by emitting holes from the second floating body 35 using the above-described method.

Hereinafter, a read operation of a memory cell of a single transistor DRAM device according to some embodiments of the invention will be described.

During the read operation of a memory cell of a DRAM device, the source region 37 is grounded. A word line read voltage lower than the word line program voltage is applied to the gate electrode 40. A bit line read voltage lower than the bit line program voltage is applied to the first drain region 27. The read operation allows a drain current to flow through the first floating body 25. The amount of the drain current depends on the amount of holes accumulated in the first floating body 25. For example, when there are holes accumulated in the first floating body 25, the read operation allows the drain current to flow. Conversely, when no holes are accumulated in the first floating body 25, the read operation allows a relatively small current to flow. Therefore, data stored in the single transistor DRAM cell can be read by sensing the drain current.

The foregoing read operation of a memory cell of a single transistor DRAM device is performed by sensing the drain current flowing through the first floating body 25. Further, a read operation of a single transistor DRAM device can be performed by sensing the drain current flowing through the second floating body 35 using the above-described method.

Meanwhile, when the backgate electrode 50 is disposed on one sidewall of the first floating body 25, a backgate bias power may be supplied to the backgate electrode 50. In this case, a negative voltage may be applied to the backgate electrode 50 due to the backgate bias power supply. Thus, the backgate bias power supply can relatively extend the retention time of the accumulated holes.

Hereinafter, methods of fabricating single transistor DRAM devices according to exemplary embodiments of the present invention will be described.

Figure 8A:
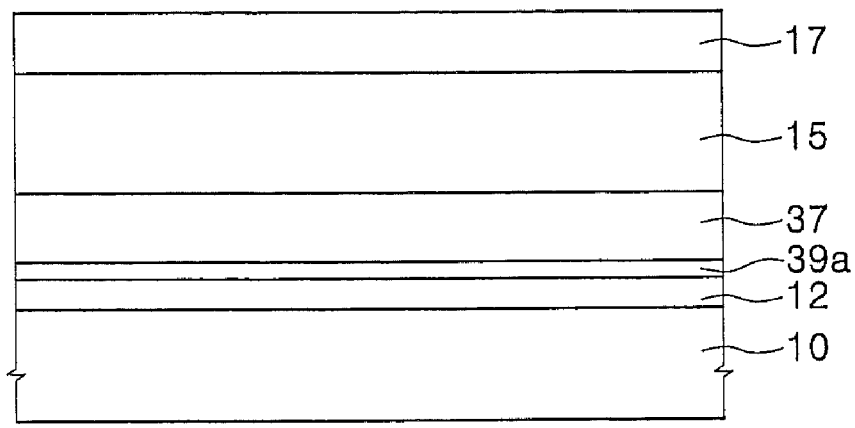
FIGS. 8A, 9A, 10A, 11A, 12A, 13A, 14A, 15A, and 16A are cross-sectional views taken along line I-I' of FIG. 3, which illustrate single transistor floating-body DRAM devices according to exemplary embodiments of the present invention and methods of fabricating the same.
Figure 8B:
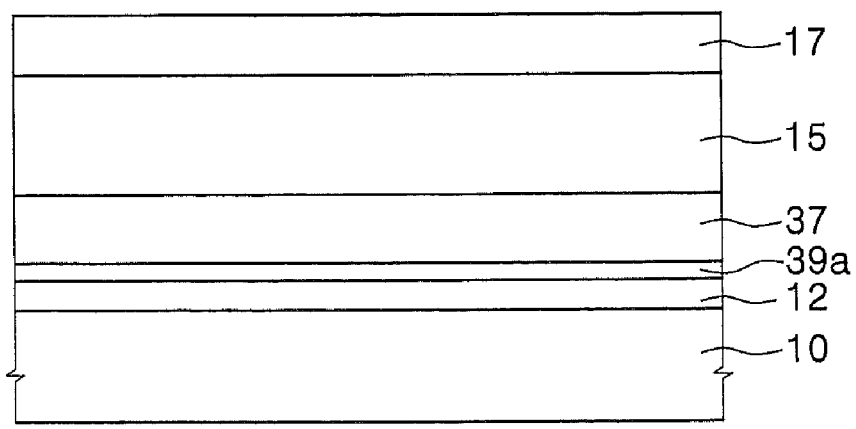
FIGS. 8B, 9B, 10B, 11B, 12B, 13B, 14B, 15B, and 16B are cross-sectional views taken along line II-II' of FIG. 3, which illustrate single transistor floating-body DRAM devices according to exemplary embodiments of the present invention and methods of fabricating the same.

Referring to FIGS. 8A and 8B, a semiconductor substrate 10 is prepared, and a body layer 15 is formed on the semiconductor substrate 10. The semiconductor substrate 10 may be an SOI substrate. The body layer 15 may be formed of silicon of a predetermined conductivity type. Impurity ions are implanted into the body layer 15 to a predetermined depth, thereby forming a first impurity region. As a result, the first impurity region is formed in a lower region of the body layer 15. The first impurity region may be a source region 37 of a first conductivity type. Impurity ions are implanted into an upper region of the body layer 15, thereby forming a second impurity region. The second impurity region may be a drain region 17 of the first conductivity type. In this case, a region of the body layer 15, which is interposed between the source region 37 and the drain region 17, may have a second conductivity type different from the first conductivity type. For example, when the first conductivity type is an N-type, the second conductivity type may be a P-type. Alternatively, when the first conductivity type is a P-type, the second conductivity type may be an N-type.

Meanwhile, before the body layer 15 is formed, a buried insulating layer 12 may be formed on the semiconductor substrate 10. As a result, the buried insulating layer 12 is interposed between the semiconductor substrate 10 and the body layer 15. The buried insulating layer 12 may be formed of silicon oxide. Other SOI techniques may be used.

Furthermore, before the source region 37 is formed, a first conductive layer 39a may be formed on the buried insulating layer 12. The first conductive layer 39a may be formed of metal.

Figure 9A:
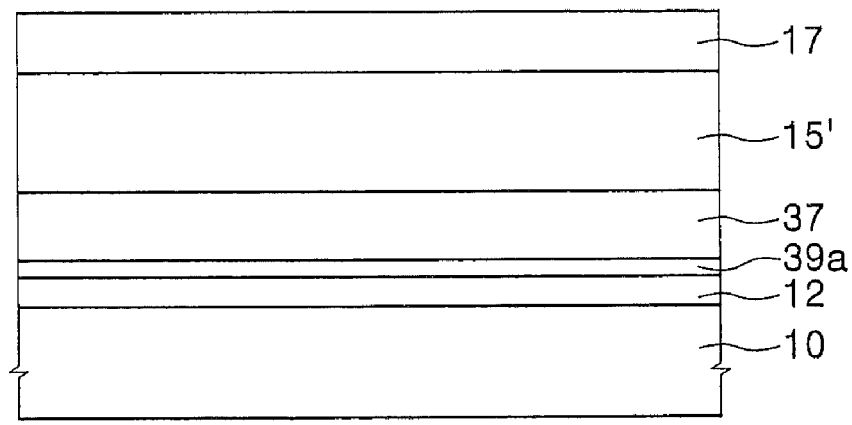
Figure 9B:
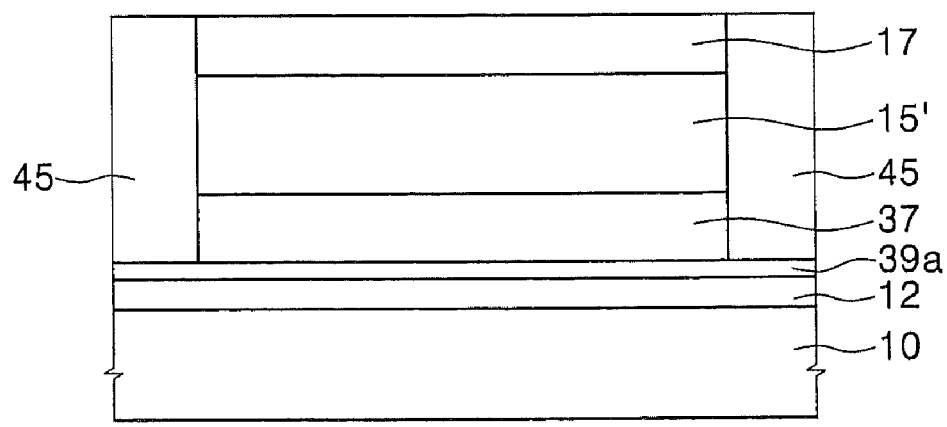

Referring to FIGS. 9A and 9B, the body layer 15 having the source region 37 and the drain region 17 is patterned until top surfaces of both end regions of the first conductive layer 39a are exposed. As a result, the source region 37, a vertical body layer pattern 15', and the drain region 17 are sequentially stacked on the semiconductor substrate 10. First isolation layers 45 may be formed on the semiconductor substrate 10 to cover sidewalls of the source region 37, the vertical body layer pattern 15' disposed on the source region 37, and the drain region 17 disposed on the vertical body layer pattern 15'. When the first conductive layer 39a is formed on the semiconductor substrate 10, the first isolation layers 45 may be formed on the first conductive layer 39a. The first isolation layers 45 may be formed of HDP oxide using an STI process. In other embodiments, the first isolation layers 45 may, be formed to cover only one sidewalls of the vertical body layer pattern 15'.

Figure 10A:
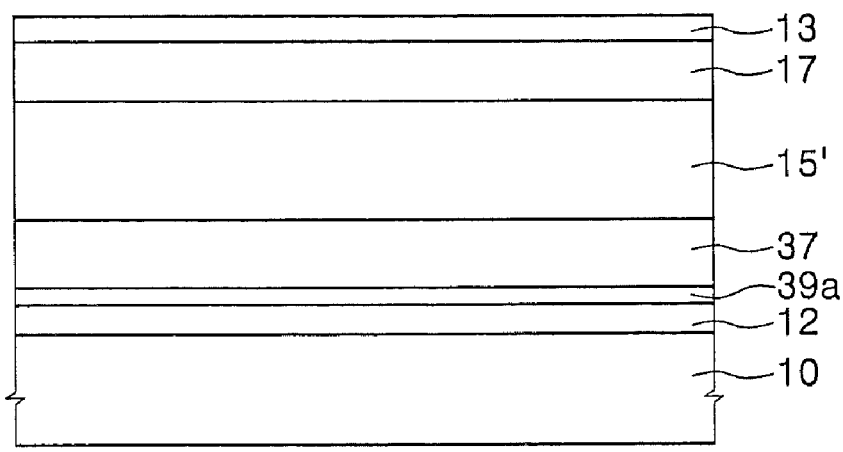
Figure 10B:
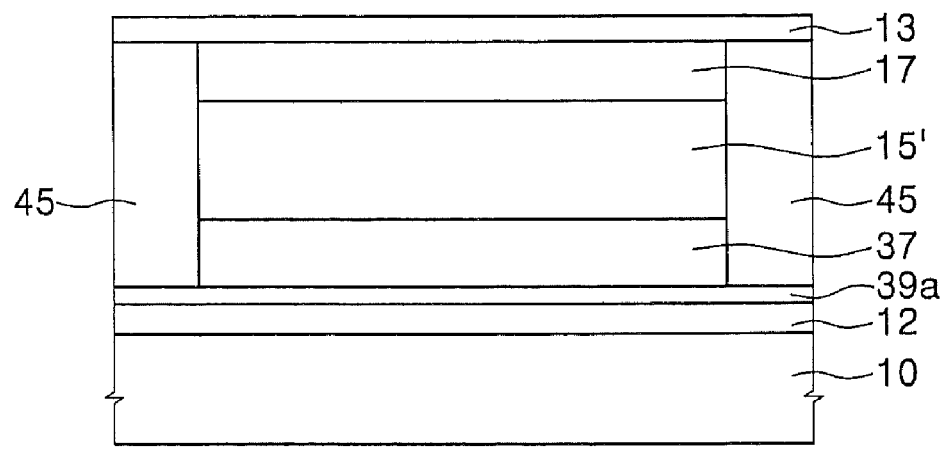

Referring to FIGS. 10A and 10B, a second conductive layer 13 may be formed on the entire surface of the semiconductor substrate 10 having the first isolation layers 45 that cover the one sidewall of the source region 37, the vertical body layer pattern 15' disposed on the source region 37, and the drain region 17 disposed on the vertical body layer pattern 15'. The second conductive layer 13 may be formed of metal.

Figure 11A:
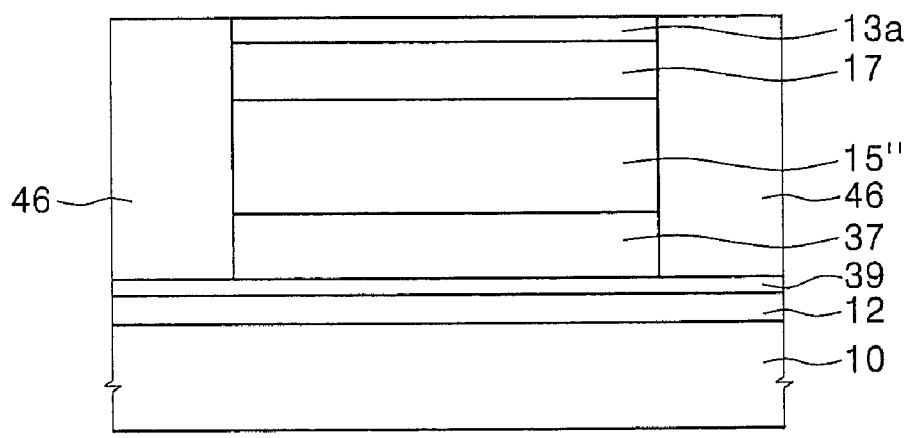
Figure 11B:
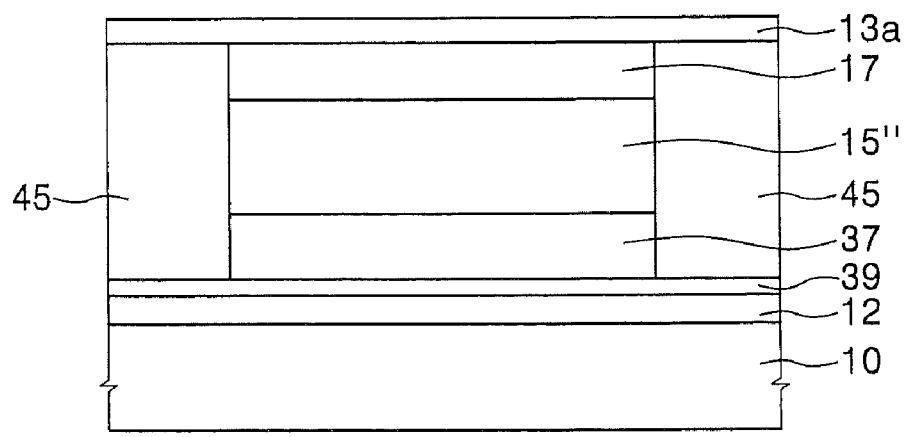

Referring to FIGS. 11A and 11B, the first conductive layer 39a, the source region 37, the vertical body layer pattern 15', the drain region 17 and the second conductive layer 13, which are sequentially stacked on the semiconductor substrate 10, are patterned until top surfaces of both ends of the semiconductor substrate 10 are exposed. As a result, a source electrode 39, the source region 37, a vertical body layer pattern 15", the drain region 17, and a second conductive layer pattern 13a are sequentially stacked on the semiconductor substrate 10.

Second isolation layers 46 may be formed on the semiconductor substrate 10 to cover other sidewalls of the source electrode 39, the source region 37, the vertical body layer pattern 15", the drain region 17, and the second conductive layer pattern 13a, which are sequentially stacked on the semiconductor substrate 10. In other embodiments, the second isolation layers 46 may be formed to cover only other sidewalls of the vertical body layer pattern 15". The second isolation layers 46 may be substantially formed on the same planar surface as the first isolation layers 45. As a result, the vertical body layer pattern 15" is electrically isolated by the first and second isolation layers 45 and 46 and the source and drain regions 37 and 17. The second isolation layers 46 may be formed of HDP oxide using an STI process.

Figure 12A:
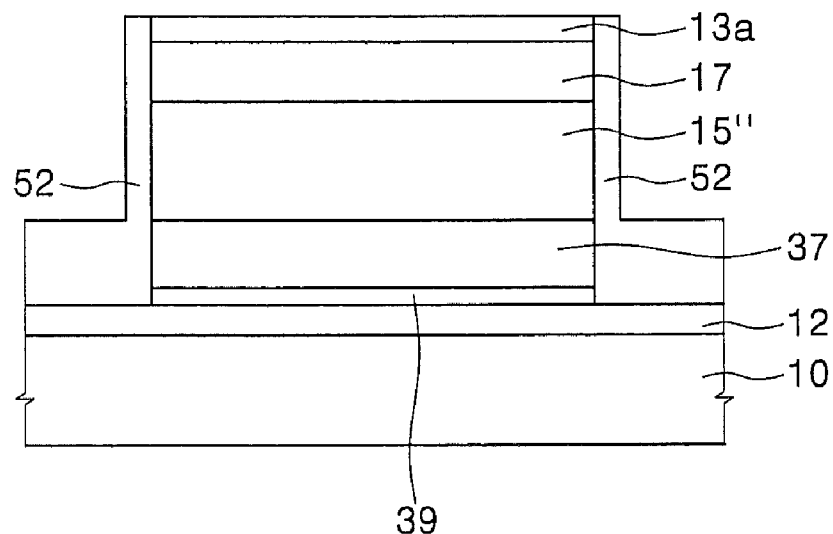
Figure 12B:
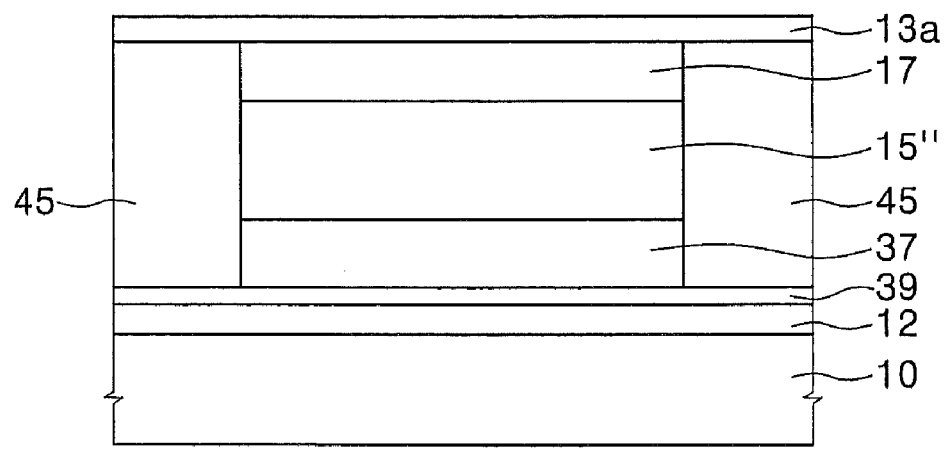

Referring to FIGS. 12A and 12B, backgate insulating layers 52 may be formed instead of the second isolation layers 46 on the semiconductor substrate 10. That is, the backgate insulating layers 52 may be formed to cover the sidewalls of the source electrode 39, the source region 37, the vertical body layer pattern 15", the drain region 17, and the second conductive layer pattern 13a, which are sequentially stacked on the semiconductor substrate 10. The backgate insulating layers 52 may be formed of silicon oxide.

Figure 13A:
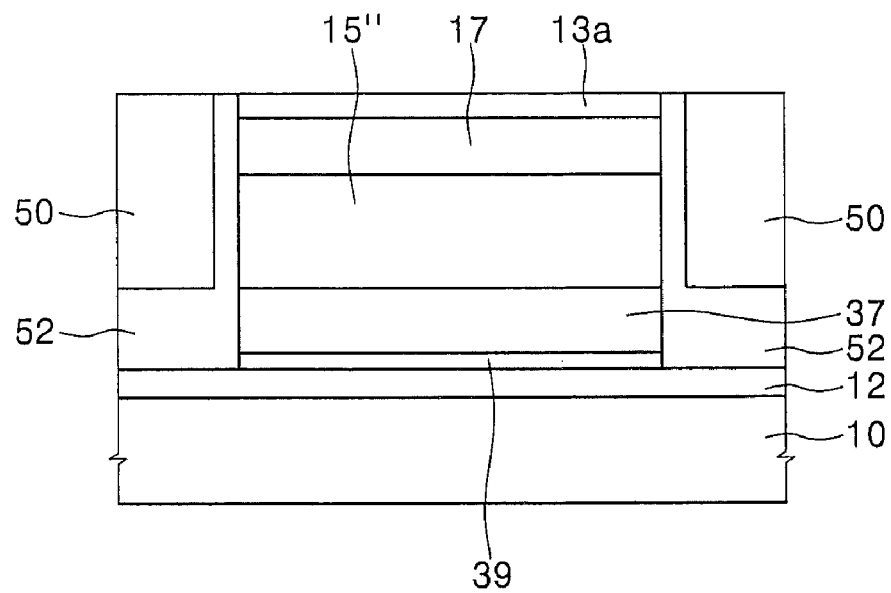
Figure 13B:
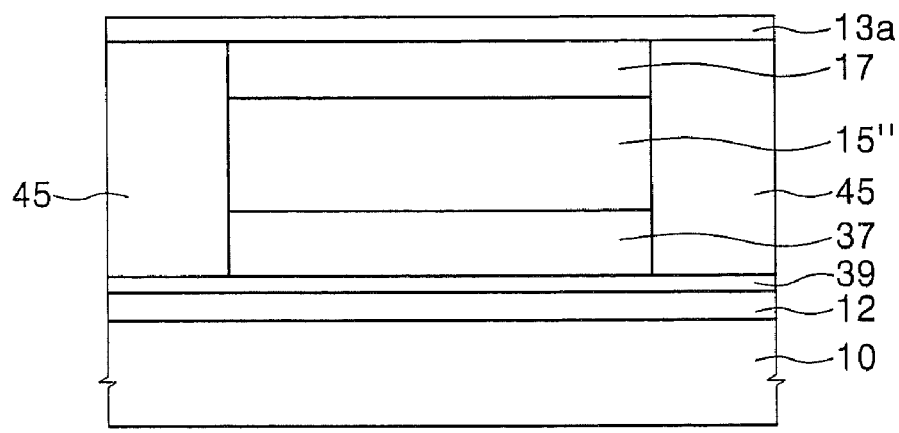

Referring to FIGS. 13A and 13B, a third conductive layer may be formed on sidewalls of the backgate insulating layer 52. The third conductive layer may be formed of polysilicon. The third conductive layer may be patterned to form backgate electrodes 50. As a result, the backgate insulating layers 52 are interposed between sidewalls of the backgate electrodes 50 and the sidewalls of the vertical body layer pattern 15". In this case, the vertical body layer pattern 15" is electrically isolated by the source region 37, the drain region 17, the first isolation layers 45, and the backgate insulating layers 52.

Figure 14A:
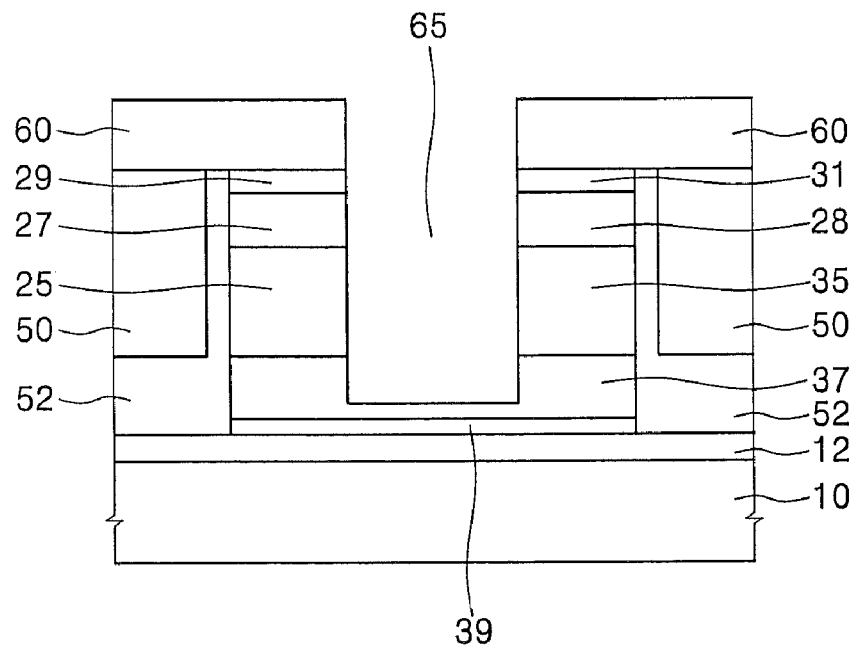
Figure 14B:
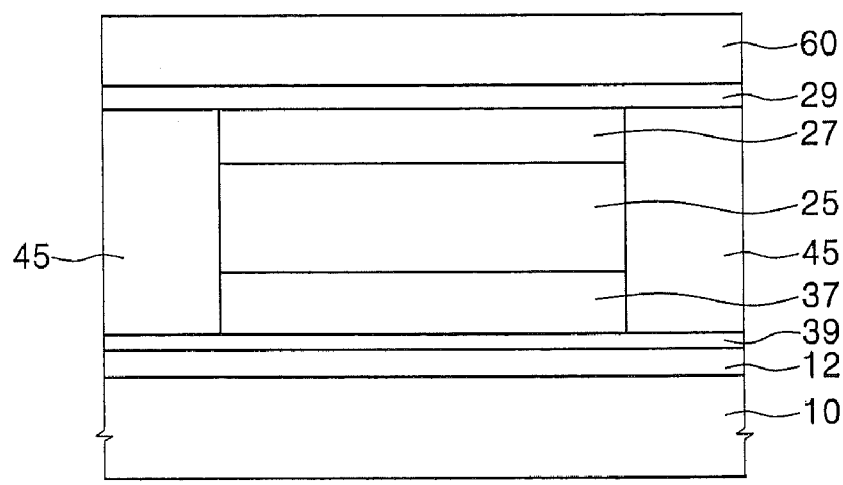

Referring to FIGS. 14A and 14B, a photoresist layer may be formed on the semiconductor substrate 10 having the source electrode 39, the source region 37, the vertical body layer pattern 15", the drain region 17, and the second conductive layer pattern 13a, which are sequentially stacked. The photoresist layer is patterned to form a photoresist pattern 60. By using the photoresist pattern 60 as an etch mask, the second conductive layer pattern 13a, the drain region 17, the vertical body layer pattern 15", and the source region 37 are selectively etched, thereby forming an opening 65 to expose a lower region of the source region 37. Then, the photoresist pattern 60 is removed. In this case, the opening 65 may expose a top surface of the lower region of the source region 37. As a result, first and second floating bodies 25 and 35, which are isolated from each other by the opening 65, are formed over the substrate 10. Also, first and second drain regions 27 and 28 may be formed on the first and second floating bodies 25 and 35, respectively, and isolated from each other by the opening 65. Further, first and second drain electrodes 29 and 31 may be formed on the first and second drain regions 27 and 28, respectively. The source region 37 disposed under the first and second floating bodies 25 and 35 may function as a common source region.

Figure 15A:
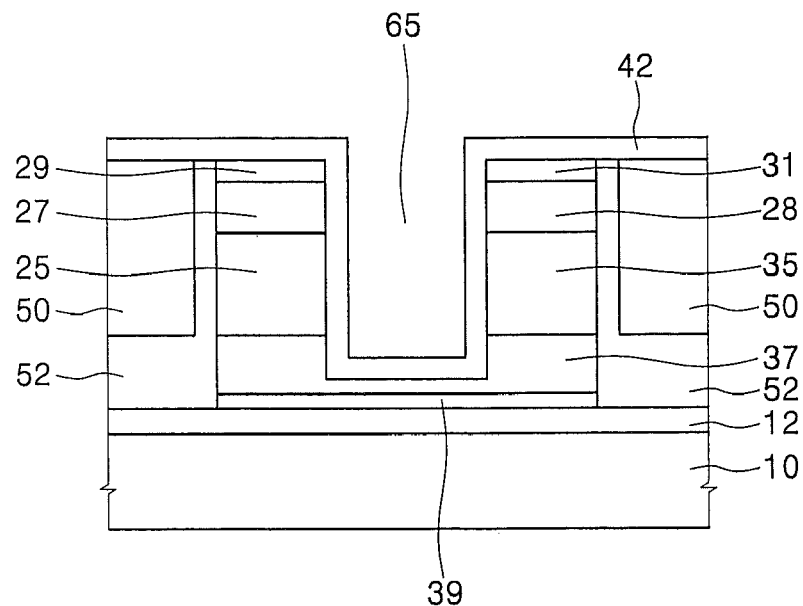
Figure 15B:
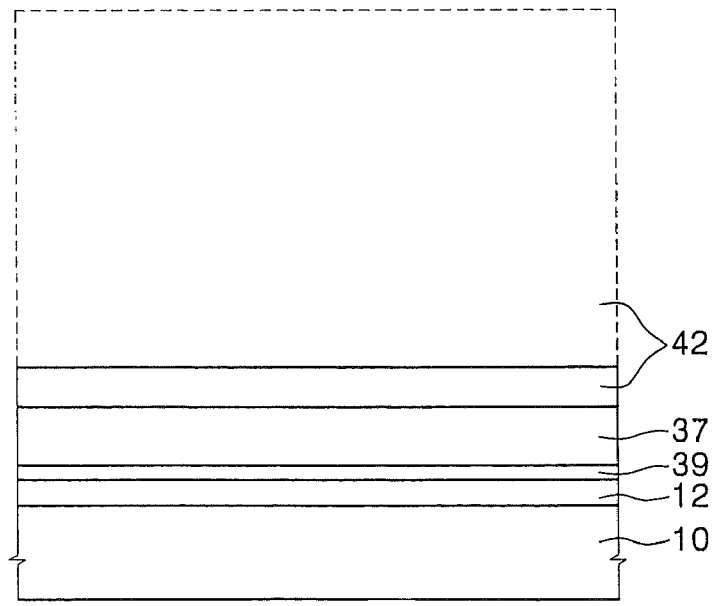

Referring to FIGS. 15A and 15B, a gate insulating layer 42 may be conformably formed on the semiconductor substrate 10 having the opening 65. As a result, the gate insulating layer 42 may be formed to cover sidewalls of the source region 37, sidewalls of the first and second floating bodies 25 and 35, and sidewalls of the first and second drain regions 27 and 28. The gate insulating layer 42 may be obtained by a thermal oxidation process.

Figure 16A:
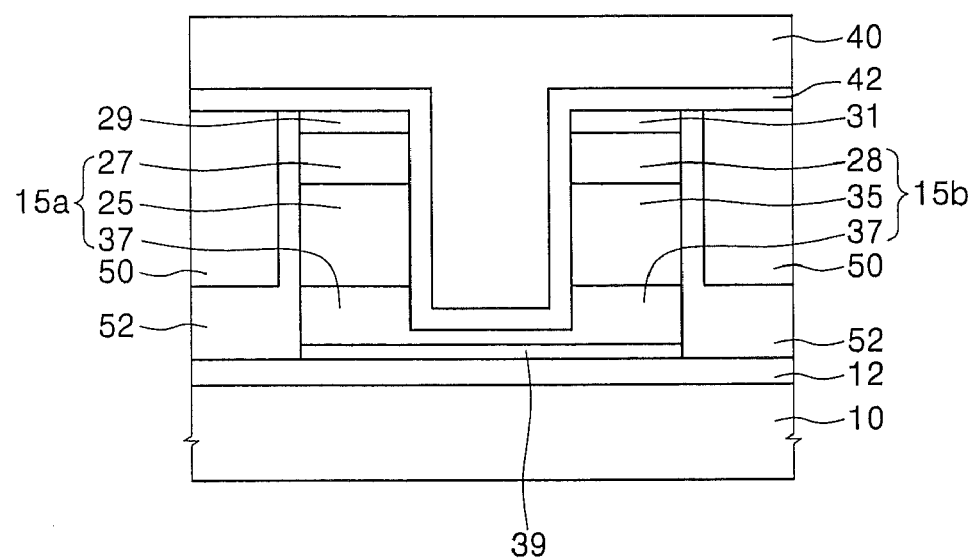
Figure 16B:
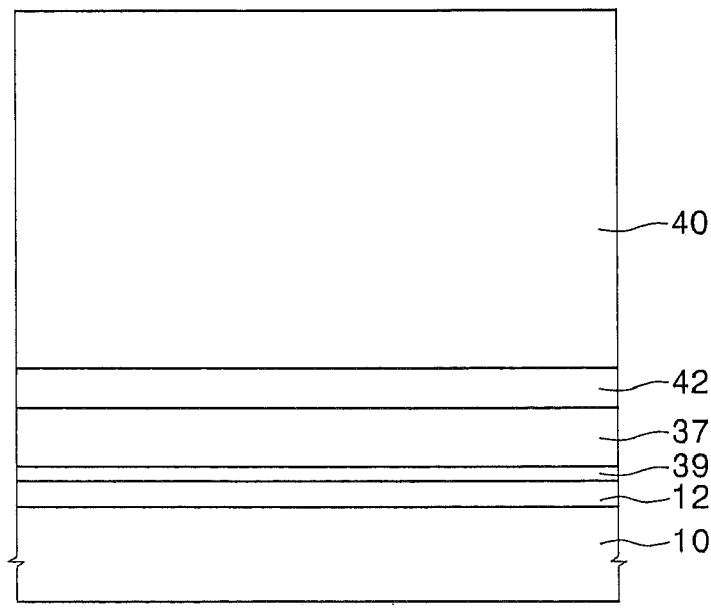

Referring to FIGS. 16A and 16B, a fourth conductive layer may be formed on the semiconductor substrate 10 having the opening 65 and the gate insulating layer 42 disposed on the opening 65. The fourth conductive layer may be patterned, thereby forming a gate electrode 40 that fills the opening 65. As a result, the first and second floating bodies 25 and 35 are isolated from each other by the gate electrode 40. Further, the first and second drain regions 27 and 28 are also isolated from each other by the gate electrode 40, and the first and second drain electrodes 29 and 31 are also isolated from each other by the gate electrode 40. Accordingly, the source region 37, the first floating body 25, and the first drain region 27, which are sequentially stacked, may constitute a first vertical body 15a. In the same manner, the source region 37, the second floating body 35, and the second drain region 28, which are sequentially stacked, may constitute a second vertical body 15b. In this case, the first and second vertical bodies 15a and 15b can have the source region 37 in common.

The gate electrode 40 may be selectively etched, thereby forming a plurality of gate electrodes. In this case, one of the gate electrodes may cover the sidewall of the first floating body 25, and the other of the gate electrodes may cover the sidewall of the second floating body 35. The fourth conductive layer may be formed of polysilicon.

According to some embodiments of the present invention as described above, a conductive channel interposed between source and drain regions may be vertically formed, and 2-bit data can be stored using a pair of floating bodies. Therefore, semiconductor memory devices can be substantially improved in integration density.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:
1. A single transistor floating body DRAM device comprising:
   a substrate;
   a pair of first and second floating bodies disposed on the substrate;
   a first source region and a first drain region respectively disposed under and above the first floating body;

a second source region and a second drain region respectively disposed under and above the second floating body; and a gate electrode disposed between the first and second floating bodies, the gate electrode further extending onto a top surface of the first drain region and further extending onto a top surface of the second drain region.

2. The device according to claim 1, wherein the gate electrode includes a first gate electrode and a second gate electrode, which are electrically insulated from each other, wherein the first gate electrode covers sidewalls of the first floating body and extends onto the top surface of the first drain region, and the second gate electrode covers sidewalls of the second floating body and extends onto the top surface of the second drain region.

3. The device according to claim 1, wherein the first and second source regions are first and second portions of a common source region.

4. The device according to claim 1, further comprising a bit line disposed on the first and second floating bodies and electrically connected to the drain region.

5. The device according to claim 1, further comprising a word line electrically connected to the gate electrode.

6. The device according to claim 1, further comprising an isolation layer surrounding sidewalls of the first and second floating bodies.

7. The device according to claim 1, further comprising a backgate electrode on sidewalls of the first and second floating bodies.

8. The device according to claim 1, further comprising a gate insulating layer interposed between the first and second floating bodies and the gate electrode.

9. The device according to claim 1, further comprising a buried insulating layer interposed between the substrate and the source region.

10. The device according to claim 1, wherein the source region and the drain region are impurity regions of a first conductivity type, and the first and second floating bodies comprise a semiconductor layer of a second conductivity type that is different from the first conductivity type.

11. The device according to claim 10, wherein the first conductivity type is an N-type, and the second conductivity type is a P-type.

12. A single transistor floating body DRAM device comprising:

a substrate;

an insulating layer on the substrate;

a semiconductor layer on the insulating layer, remote from the substrate;

the semiconductor layer comprising a semiconductor source region on the insulating layer, a semiconductor floating body region on the semiconductor source region remote from the insulating layer and a semiconductor drain region on the semiconductor floating body region remote from the semiconductor source region, the respective semiconductor source and drain regions defining respective first and second semiconductor junctions with the semiconductor floating body region at respective opposite ends thereof and further defining at least one sidewall of the semiconductor floating body region therebetween;

an insulating region on the semiconductor floating body region that is configured to electrically isolate the at least one sidewall of the semiconductor floating body region so as to allow charge carriers to be stored in the semiconductor floating body region that is isolated; and a gate electrode on the insulating region, remote from the semiconductor floating body region, and extending onto a top surface of the semiconductor drain region.

\* \* \* \* \*